United States Patent [19]

Tokitomo et al.

[11] Patent Number: 5,126,220
[45] Date of Patent: Jun. 30, 1992

[54] RETICLE FOR PHOTOLITHOGRAPHIC PATTERNING

[75] Inventors: Kazuo Tokitomo, Kawasaki; Yasutaka Ban, Yokohama; Kenji Sugishima, Inagi, all of Japan

[73] Assignee: Fujitsu Limited, Kanagawa, Japan

[21] Appl. No.: 648,697

[22] Filed: Jan. 31, 1991

[30] Foreign Application Priority Data

Feb. 1, 1990 [JP] Japan .................................. 2-20496

[51] Int. Cl.$^5$ .............................................. G03F 9/00
[52] U.S. Cl. ...................................... 430/5; 430/290; 430/296; 430/321; 250/492.2; 250/492.3; 250/398
[58] Field of Search .................. 430/5, 290, 296, 321; 250/492.2, 492.3, 398

[56] References Cited

U.S. PATENT DOCUMENTS

| | | | |
|---|---|---|---|
| 5,023,156 | 6/1991 | Takeuchi et al. | 430/5 |
| 5,045,417 | 9/1991 | Okamoto | 430/5 |

FOREIGN PATENT DOCUMENTS

| | | | |
|---|---|---|---|
| 0090924 | 12/1983 | European Pat. Off. | 430/5 |
| 0128251 | 6/1986 | Japan | 430/5 |

OTHER PUBLICATIONS

Levenson, M. D. et al, "Improving Resolution in Photolithography with a Phase-Shifting Mask", IEEE Transactions on Electron Devices, vol. ED-29, No. 12, Dec. 1982.

Primary Examiner—Charles L. Bowers, Jr.
Assistant Examiner—Thomas R. Neville
Attorney, Agent, or Firm—Nikaido, Marmelstein, Murray & Oram

[57] ABSTRACT

A reticle comprises a substrate transparent to an optical beam, an opaque layer provided on the substrate for interrupting the optical beam according to the desired pattern, the opaque layer being patterned to form an opaque pattern that interrupts the optical beam and a transparent pattern that transmits the optical beam selectively according to the desired pattern; and a phase shift pattern transparent to the optical beam for transmitting the optical beam therethrough, wherein the phase shift pattern comprises an electrically conductive material and provided on the substrate in correspondence to the transparent pattern in the opaque layer, for canceling the diffraction of the optical beam passed through the transparent pattern.

6 Claims, 2 Drawing Sheets

RETICLE FOR PHOTOLITHOGRAPHIC PATTERNING

BACKGROUND OF THE INVENTION

The present invention generally relates to photolithographic patterning of semiconductor devices and more particularly to a reticle used for the photo lithographic patterning process to form a device pattern on a semiconductor wafer by an ultraviolet or deep ultraviolet light.

The large scale integrated circuits (LSIs) has increased the integration density by about four times in the last three or four years. The demand for increasing the integration density persists and various patterning processes are under investigation for forming extremely fine semiconductor patterns on a semiconductor wafer with an improved resolution.

The photolithographic patterning process that uses ultraviolet or deep ultraviolet lights for the patterning is one of the major patterning processes currently used. This process uses a mask or reticle carrying thereon a semiconductor pattern in an enlarged scale and is particularly advantageous for mass producing the semiconductor devices with large throughput. On the other hand, the process relies upon the photochemical reaction in the photoresist caused by the ultraviolet light that has passed through the reticle and associated therewith, has an inherent problem of poor resolution due to the diffraction of light at the edge of the reticle pattern. This problem becomes particularly acute when the size of the semiconductor pattern to be written on the wafer is decreased in correspondence to the increased integration density. Although various efforts are made to minimize the problem of unwanted diffraction such as use of the deep ultraviolet lights having shorter wavelengths or increase of the numeric aperture of the exposure system, such improvements are approaching the limit.

The reticles for the photolithographic patterning have conventionally been produced by patterning a metal layer grown on a substrate by electron beam or ultraviolet beam. The reticle thus produced is used in a photolithographic exposure system for selectively interrupting an ultraviolet or deep ultraviolet beam used for exposing the photoresist covering the wafer, according to the desired semiconductor pattern.

In order to suppress the Fresnel diffraction of the light that has passed through the reticle, there is a proposal to provide a phase shift region on the pattern on the reticle at selected locations to cancel out the diffracted light beam (Levenson, M.D. et al., "Improving Resolution in Photolithography with a PhaseShifting Mask," IEEE Transactions on Electron Devices, vol.ED-29, no.12, December, 1982.)

FIGS.1(A)–1(C) show the principle of suppressing the Fresnel diffraction proposed in the foregoing reference.

Referring to FIG.1(A) showing an exposure process using a conventional reticle, a glass substrate 1 is provided with an opaque pattern 3 of chromium and the like that selectively interrupts an ultraviolet light designated as UV according to a desired semiconductor pattern. Further a phase shift pattern 2 is provided between a pair of adjacent opaque patterns 3 for shifting the phase of the ultraviolet light passing therethrough with respect to the ultraviolet light that has passed through the reticle without being modified the phase by the phase shift pattern 2.

FIG.1(B) shows a typical distribution of the electric field E of transmitted light beam that has passed through the reticle and FIG.1(C) shows the corresponding distribution of the intensity of the light beam, wherein the solid line represents the case where the phase shift pattern 2 is provided and the broken line represents the case where no such phase shift pattern is provided. As can be seen from FIG.1(B) and FIG.1(C), the transmitted light beam has a finite intensity even in the region immediately under the opaque pattern 3 when the phase shift pattern 2 is not provided, because of the diffraction of the light. On the other hand, when the pattern 2 is provided, the phase of the light beam that has passed through the pattern 2 can be made opposed with respect to the light beam that has passed through the reticle without being shifted the phase thereof. Thereby, a zero-crossing appears in the distribution of the electric field in correspondence to the opaque pattern 3 as shown in FIG.1(B) by the continuous line, and a sharply defined, high resolution pattern shown in FIG.1(C) by the continuous line, is projected on the wafer.

Conventionally, the phase shift pattern 2 has been formed of an insulating material such as silicon oxide or organic material. In forming such a pattern by an electron beam lithography, there has been a problem in that electrons are accumulated in the insulating film forming the pattern 2 as well as in organic resist 4 as shown in FIG.2, and the electron beam is offset from the aimed point because of the coulomb repulsion. Because of this problem, the conventional reticle could not be formed with satisfactorily high resolution.

SUMMARY OF THE INVENTION

Accordingly, it is a general object of the present invention to provide a novel and useful reticle wherein the foregoing problems are eliminated.

Another and more specific object of the present invention is to provide a reticle that does not cause charge-up during the fabrication process when irradiated by a charged particle beam.

Another object of the present invention is to provide a reticle comprising an optically transparent substrate, an opaque pattern provided on the substrate for interrupting a light beam incident to the substrate, said opaque pattern being formed with a transparent pattern to pass the light beam shaped according to a desired semiconductor pattern, and a phase shift pattern provided on the substrate in correspondence to the light beam that has passed through the transparent pattern for shifting a phase of the light beam, wherein said phase shift pattern comprises an optically transparent and electrically conductive material. According to the present invention, the patterning process of the phase shift pattern by charged beam lithography such as the electron beam lithography does not cause charge-up of the material forming the phase shift pattern or resist employed for the patterning, and an accurate patterning of the phase shift pattern becomes possible. Thereby, efficient cancellation of the diffraction by the phase shift pattern becomes possible even when the size of the semiconductor device to be projected becomes extremely small.

Other objects and further features of the present invention will become apparent from the following de-

DETAILED DESCRIPTION

FIGS.3(A)-3(G) are the diagrams showing the process of forming the reticle according to an embodiment of the present invention.

Figure 3A:
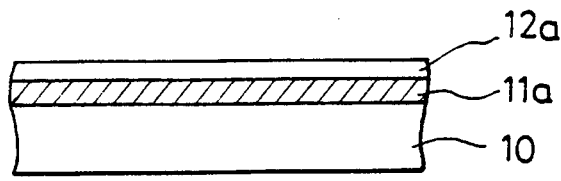
FIGS.3(A)-(G) are diagrams showing the process of forming the reticle having the phase shift pattern according to an embodiment of the present invention.

Referring to FIG.3(A) at first, an opaque film 11a of chromium or chromium oxide is deposited on a quartz substrate having a thickness of typically 1.5-2.0 mm. Further, a resist 12a is deposited on the opaque film 11a as illustrated.

Figure 3B:
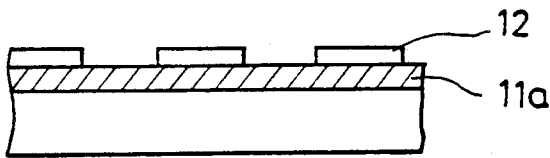

In a step of FIG.3(B), the resist 12a is patterned by an electron beam exposure process to form a patterned resist 12 according to a desired device pattern. Further, the opaque film 11a is patterned in a step of FIG.3(C) by a dry etching or wet etching process, using the patterned resist 12 as the mask. Thereby, an opaque reticle pattern 11 is formed in correspondence to the device pattern carried by the patterned resist 12a as illustrated, leaving transparent regions 11' and 11'' between the patterns 11.

Figure 1A:
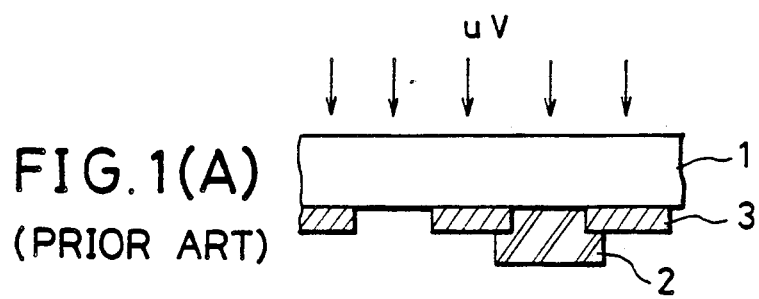
FIGS.1(A)-1(C) are diagrams showing the principle of improving resolution of patterning by the use of phase shift pattern.
Figure 1B:
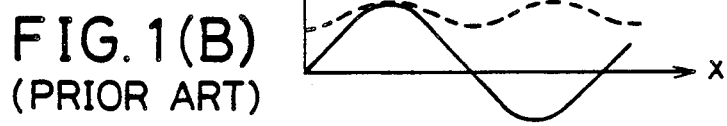
Figure 1C:
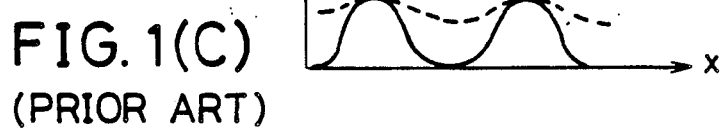
Figure 2:
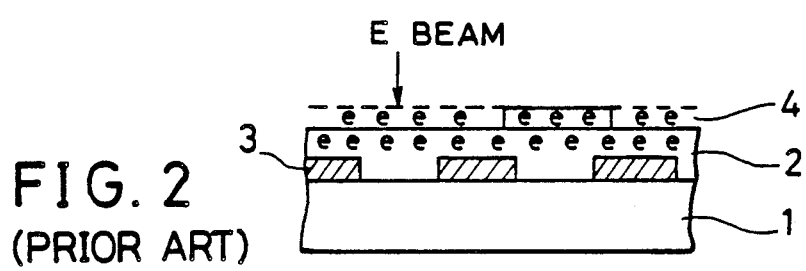
FIG.2 is a diagram explaining the problem pertinent to the conventional process of forming the phase shift pattern in a reticle.
Figure 3C:
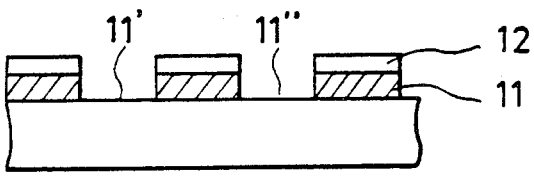
Figure 3D:
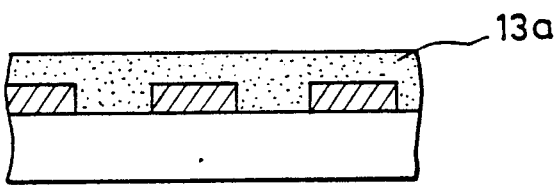

Next, the resist 12 is removed and a layer 13a of an electrically conductive transparent material such as indium tin oxide ($In_2O_3.SnO_2$) commonly known as ITO or tin oxide ($SnO_2$) is deposited on the substrate 10 to bury the reticle pattern 11 underneath as illustrated in FIG.3(C). The deposition of the layer 13a is made such that the layer 13a has a thickness $\alpha$ satisfying a relation:

$$\alpha + \lambda/2(n-1)$$

where $\lambda$ represents the wavelength of the ultraviolet or deep ultraviolet light that is used for transferring the device pattern on a wafer, and n represents the refractive index of the layer 13a. It should be noted that the canceling of the diffraction by the phase shift pattern as described with reference to FIGS.1(A)-1(C) can be achieved when the foregoing relation is satisfied. When using the light beam having the wavelength of 0.4 $\mu$m for the exposure and the layer 13a has the refractive index of 2, the thickness $\alpha$ that satisfies the foregoing relationship is determined to be 0.2 $\mu$m. It should be noted that the layer 13a is a conductive film.

Figure 3E:
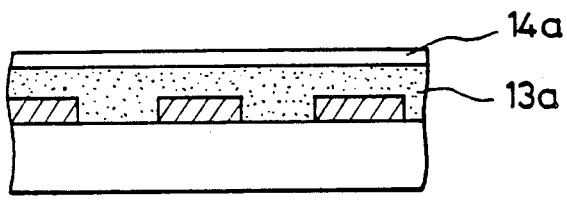
Figure 3F:
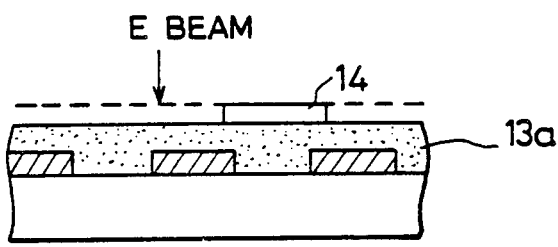

Next, a resist 14a is deposited on the layer 13a as shown in FIG.3(E), and the resist 14a is patterned by an electron beam according to a desired phase shift pattern to form a patterned resist 14 as shown in FIG.3(F). During this process, it should be noted that the electrons incident to the resist 14 as the electron beam are immediately dissipated through the conductive layer 13a to the ground and no charge-up occurs in the resist 14 or in the layer 13a. Thus, the electron beam used for the patterning of the resist 14a hits the resist accurately. No stray of the electron beam spot by the charge-up occurs in this process.

Figure 3G:
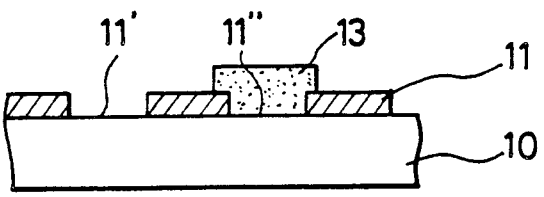

Next, the layer 13a is patterned using the patterned resist 14 as the mask and a desired phase shift pattern 13 is obtained as shown in FIG.3(G). As shown in FIG.3(G), the phase shift pattern 13 is provided in correspondence to the transparent region 11'' while the adjacent transparent region 11' is left not covered by the phase shift pattern 13. Thereby, the canceling of diffraction of the ultraviolet light beams that have passed through the region 11' and the region 11'' is achieved as explained with reference to FIGS.1(A)-1(C).

When the layer 13a is made of ITO, the patterning of the step of FIG.3(G) is achieved by a dry etching process using a mixture of $CH_4/H_2$ with a gas pressure of $5 \times 10^{-3}$ torr and an RF power of 300 watts for 3-5 minutes. During the dry etching, the temperature of the substrate is set to 70° C. As an alternative of $CH_4$, butyl acetate or carbon tetrachloride may be used. The duration is of course adjusted to obtain the necessary thickness described previously.

When the layer 13a is made of $SnO_2$, on the other hand, a mixture of hydrogen and butyl acetate containing 40% of butyl acetate may be used. In this case, the pressure is set to about $10^{-3}$ torr and an RF power of 200-500 watts is applied for about one minute.

According to the foregoing process, the phase shift pattern 13 can be formed with high precision and thereby an effective cancellation of diffraction is achieved.

Further, the present invention is by no means limited to the embodiments described heretofore, but various variations and modifications may be made without departing from the scope of the invention.

What is claimed is:

1. A reticle for projecting a pattern on an object by an optical beam, comprising:

a substrate having an upper major surface and a lower major surface, said substrate being transparent to the optical beam for transmitting the optical beam therethrough;

an opaque layer having an upper major surface and a lower major surface and provided on the upper major surface of the substrate in contact therewith for interrupting the optical beam according to the desired pattern, said opaque layer being patterned to form an opaque pattern that interrupts the optical beam incident thereto and a transparent pattern that transmits the optical beam selectively according to the desired pattern; and a phase shift pattern transparent to the optical beam for transmitting the optical beam therethrough, said phase shift pattern having an upper major surface and a lower major surface and provided on the upper major surface of the substrate in correspondence to the transparent pattern formed in the opaque layer, for canceling a diffraction of the optical beam passed through the transparent pattern;

wherein said phase shift pattern is formed of a material selected from a group consisting of indium tin oxide and tin oxide.

2. A reticle as claimed in claim 1 in which said phase shift pattern comprises indium tin oxide.

3. A reticle as claimed in claim 1 in which said phase shift pattern comprises tin oxide.

4. A reticle as claimed in claim 1 in which said phase shift pattern has a thickness determined to achieve the canceling of the diffraction of the optical beam.

5. A reticle as claimed in claim 1 in which said phase shift pattern has a refractive index determined to achieve the canceling of the diffraction of the optical beam.

6. A mask for projecting a pattern on an object by an optical beam with a magnification set to unity, comprising:

a substrate having an upper major surface and a lower major surface, said substrate being transparent to the optical beam for transmitting the optical beam therethrough;

an opaque layer having an upper major surface and a lower major surface and provided on the upper major surface of the substrate in contact therewith for interrupting the optical beam according to the desired pattern, said opaque layer being patterned to form an opaque pattern that interrupts the optical beam incident thereto and a transparent pattern that transmits the optical beam selectively according to the desired pattern; and a phase shift pattern transparent to the optical beam for transmitting the optical beam therethrough, said phase shift pattern having an upper major surface and a lower major surface and provided on the upper major surface of the substrate in correspondence to the transparent pattern formed in the opaque layer, for canceling a diffraction of the optical beam passed through the transparent pattern;

wherein said phase shift pattern is formed of a material selected from a group consisting of indium tin oxide and tin oxide.

* * * * *